United States Patent
Fujita et al.

(10) Patent No.: US 9,077,184 B2
(45) Date of Patent: Jul. 7, 2015

(54) CONTROL DEVICE TO CONTROL DETERIORATION OF BATTERIES IN A BATTERY STACK

(75) Inventors: Takeshi Fujita, Hayama-machi (JP); Takuya Kinoshita, Yokohama (JP); Yasuhiro Yanagihara, Yamato (JP)

(73) Assignee: NISSAN MOTOR CO., LTD., Yokohama-shi, Kanagawa (JP)

( * ) Notice: Subject to any disclaimer, the term of this patent is extended or adjusted under 35 U.S.C. 154(b) by 170 days.

(21) Appl. No.: 13/978,202

(22) PCT Filed: Dec. 16, 2011

(86) PCT No.: PCT/JP2011/079144
§ 371 (c)(1),
(2), (4) Date: Jul. 3, 2013

(87) PCT Pub. No.: WO2012/098794
PCT Pub. Date: Jul. 26, 2012

(65) Prior Publication Data
US 2013/0285613 A1    Oct. 31, 2013

(30) Foreign Application Priority Data
Jan. 18, 2011  (JP) ................. 2011-007437

(51) Int. Cl.
H02J 7/00       (2006.01)
H01M 10/44   (2006.01)
(Continued)

(52) U.S. Cl.
CPC ............. *H02J 7/00* (2013.01); *H02J 7/0077* (2013.01); *H02J 7/045* (2013.01); *Y02T 10/7044* (2013.01); *H02J 7/042* (2013.01); *H02J 7/04* (2013.01); *H02J 7/0088* (2013.01); *Y02T 10/7038* (2013.01); *H02J 7/0091* (2013.01); *H02J 7/0086* (2013.01); *H01M 10/44* (2013.01); *H01M 10/441* (2013.01); *H01M 10/443* (2013.01); *H01M 10/48* (2013.01); *H01M 10/482* (2013.01); *H01M 10/486* (2013.01); *H02J 7/0013* (2013.01); *H02J 7/047* (2013.01); *H01M10/425* (2013.01); *H01M 2010/4271* (2013.01); *G01R 31/3679* (2013.01)

(58) Field of Classification Search
CPC ............. H02J 7/04; H02J 7/042; H02J 7/045; H02J 7/047; H02J 7/0077; H02J 7/0086; H02J 7/0088; H02J 7/0091; Y02T 10/7038; Y02T 10/7044
USPC .......................... 320/126–127, 132, 135, 137
See application file for complete search history.

(56) References Cited

U.S. PATENT DOCUMENTS 7,456,610 B2 * 11/2008 Yamashita .................... 320/119
7,471,066 B2 * 12/2008 Ambrosio et al. ............ 320/119
(Continued)

FOREIGN PATENT DOCUMENTS

JP    H07-153498 A    6/1995
JP    2009-044862 A    2/2009
(Continued)

*Primary Examiner* — Stacy Whitmore
(74) *Attorney, Agent, or Firm* — Young Basile

(57) ABSTRACT

Provided is a storage battery system comprising a plurality of storage batteries connected in parallel, characterized by detecting the temperature and energy amount of each battery connected in parallel, calculating the deterioration rate of each battery based on the detected temperature and energy-amount, and controlling the power amount to be inputted to and output from each battery so that the deterioration rate of each storage battery will come closer to each other.

6 Claims, 5 Drawing Sheets

(51) Int. Cl.
*H01M 10/48* (2006.01)
*H01M 10/42* (2006.01)
*H02J 7/04* (2006.01)
*G01R 31/36* (2006.01)

(56) References Cited

U.S. PATENT DOCUMENTS

| | | | |
|---|---|---|---|
| 8,089,247 B2* | 1/2012 | Pellenc | 320/112 |
| 2005/0068005 A1* | 3/2005 | Yamashita | 320/116 |
| 2007/0108944 A1* | 5/2007 | Pellenc | 320/130 |
| 2012/0256752 A1* | 10/2012 | Musser et al. | 340/636.2 |
| 2013/0038333 A1* | 2/2013 | Harada | 324/431 |
| 2013/0076313 A1* | 3/2013 | Kim et al. | 320/150 |
| 2014/0172196 A1* | 6/2014 | Hayashi | 701/2 |

FOREIGN PATENT DOCUMENTS

| | | |
|---|---|---|
| JP | 2010-104129 A | 5/2010 |
| JP | 2010-239711 A | 10/2010 |

* cited by examiner

FIG.4

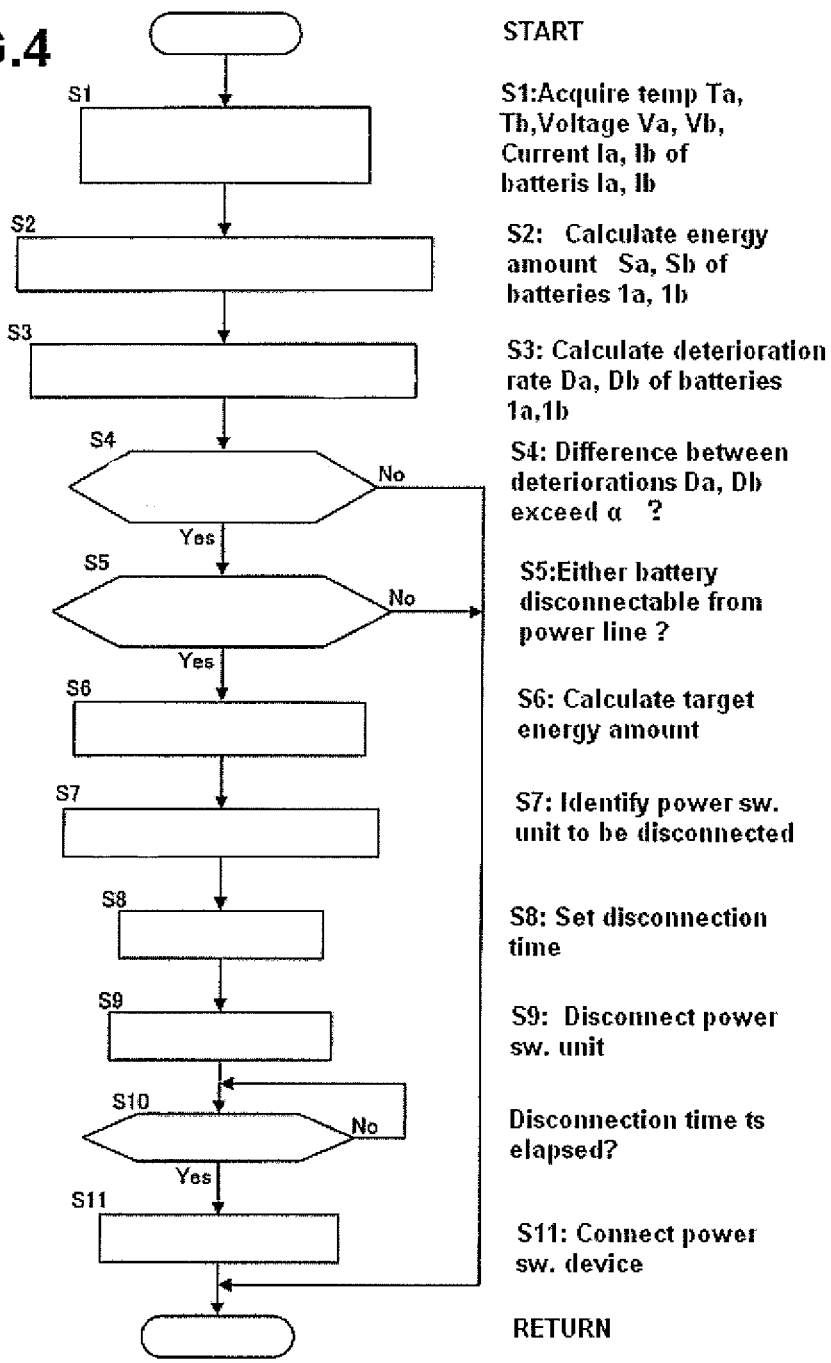

START

S1: Acquire temp Ta, Tb, Voltage Va, Vb, Current Ia, Ib of batteris 1a, 1b

S2: Calculate energy amount Sa, Sb of batteries 1a, 1b

S3: Calculate deterioration rate Da, Db of batteries 1a,1b

S4: Difference between deteriorations Da, Db exceed α ?

S5: Either battery disconnectable from power line ?

S6: Calculate target energy amount

S7: Identify power sw. unit to be disconnected

S8: Set disconnection time

S9: Disconnect power sw. unit

Disconnection time ts elapsed?

S11: Connect power sw. device

RETURN

CONTROL DEVICE TO CONTROL DETERIORATION OF BATTERIES IN A BATTERY STACK

TECHNICAL FIELD

The present invention relates to a battery control device for controlling a storage battery system consisting of a plurality of storage batteries connected in parallel.

BACKGROUND

Conventionally, as a storage battery system used in relatively severe temperature environments, a stationary storage battery system is known. The stationary storage battery system is normally used by connecting a plurality of batteries in parallel. However, in a structure in which a plurality of batteries is connected in parallel, each battery connected in parallel is often placed in a different temperature environment. When placed in such a different temperature environment, the deterioration rate may differ from battery to battery so that the variation in deterioration between the batteries are facilitated with the result that the overall lifetime of the stationary battery system becomes short. On the other hand, in order to place each battery in the same temperature environment, performing a temperature control to each storage battery may be considered. In this case, however, a temperature control system with each storage battery would be necessary.

In contrast, for example, in Japanese Patent Application Publication No. H7-153498, it is disclosed that, in the storage battery system consisting of two batteries connected in parallel, when a temperature difference is occurring between batteries, in order to suppress the variations in deterioration between batteries, the battery of low temperature is first charged, and after completion of the charging operation with the battery of low temperature, the high-temperature battery will be charged.

However, in the prior art described above, while the temperature difference is occurring between batteries, only the timing of battery charging is controlled, and since no consideration is given to the deterioration rate attributable to energy amount of storage battery, there is a problem that variations in deterioration between batteries may not be sufficiently resolved.

BRIEF SUMMARY

The problem to be solved by the present invention resides in that, in a battery control device for controlling a battery system composed of a plurality of batteries connected in parallel, without using a temperature control system, the variations in deterioration between batteries connected in parallel may be suppressed thereby improving the lifetime of the storage battery system.

According to the present invention, in a storage battery system consisting of a plurality of storage batteries connected in parallel, a temperature and energy amount of each storage battery are detected, and based on the detected temperature and energy amount, a deterioration rate of each battery is calculated, and the amount of power to be input to and output from will be controlled so that the deterioration rates of respective batteries come to close to each other.

According to the present invention, since the amount of power to be input to or output from each battery is controlled to cause the deterioration rates for respective storage batteries calculated based on the temperature and energy amount of each battery connected in parallel to be close to each other, the variations in deterioration rates may be suppressed and, as a result, the lifetime of the storage battery system may be improved.

BRIEF DESCRIPTION OF THE DRAWINGS

The description herein makes reference to the accompanying drawings wherein like reference numerals refer to like parts throughout the several views, and wherein:

FIG. 4 is a flowchart illustrating the deterioration rate adjustment process according to the present embodiment.

DETAILED DESCRIPTION

An embodiment according to the present invention will now be described below with reference to the accompanying drawings.

Figure 1:
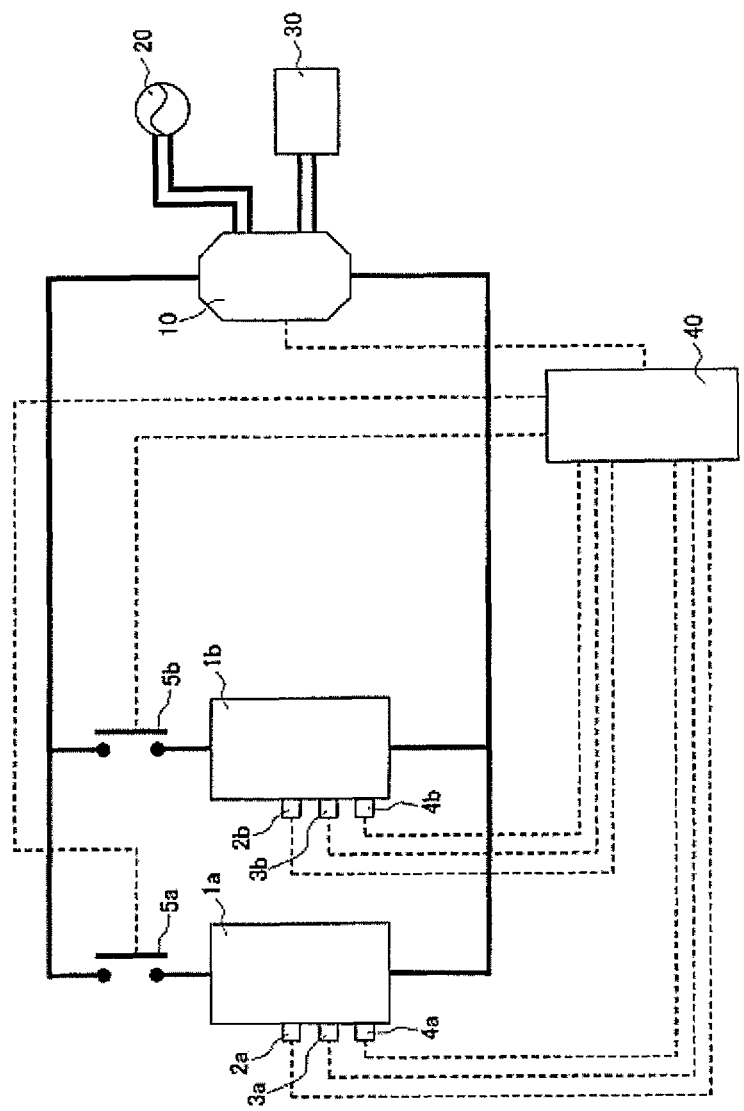
FIG. 1 is a diagram showing the configuration of the storage battery system according to the present embodiment.

FIG. 1 is a block diagram showing a storage battery system according to the present embodiment. Although the battery system in the present embodiment is explained as applied to an example of stationary storage battery system, no particular limitation is present to this example.

As shown in FIG. 1, the storage battery system in the present embodiment is provided with a first storage battery $1a$, second storage battery $1b$, a converter 10, an AC power source 20, an AC load 30, and a controller 40. The first storage battery $1a$ and the second storage battery $1b$ are connected to each other in parallel through the power line, and are further connected to a converter 10. Further, the first storage battery $1a$ and the second storage battery $1b$ can receive via the converter 10 power from AC power source 20. Note that, in FIG. 1, the bold solid line indicates a power line while the broken line denotes a communication line.

For example, the first storage battery $1a$ is a lithium ion secondary battery, and is provided with a first temperature sensor $2a$ for detecting the temperature Ta of the first battery $1a$, a first voltage sensor $3a$ for detecting the voltage Va of the first battery $1a$, and a first current sensor $4a$ for detecting current $1a$ to be input to or output from first battery 1a. Further, the temperature Ta, voltage Va, and current Ia detected by the first temperature sensor $2a$, first voltage sensor $3a$, and first current sensor $4a$, respectively, will be transmitted to controller 40 at a predetermined interval.

In addition, the first battery $1a$ is provided with a first power switching unit $5a$, and by performing an ON/OFF control on the first power switching unit $5a$, connection and disconnection to the power line may be selectively available.

Similarly, the second storage battery $1b$ is a lithium ion secondary battery for example, and this second battery is likewise provided with a second temperature sensor $2b$ for detecting the temperature Tb of the second battery $1b$, a second voltage sensor $3b$ for detecting the voltage Vb of the second battery $1b$, and a second current sensor $4b$ for detecting current Ib to be input to or output from second battery $1b$.

Further, the temperature Tb, voltage Vb, and current Ib detected by the second temperature sensor 2b, second voltage sensor 3b, and second current sensor 4b, respectively, will be transmitted to controller 40 at a predetermined time interval.

In addition, the second battery 1b is also provided with a second power switching unit 5b, and by performing an ON/OFF control on the second power switching unit 5b, connection and disconnection to the power line may be selectively available.

The converter 10 is a converter for converting between AC power and DC power. The converter 10 converts the direct power from the first battery 1a and second battery 1b to Ac power for supplying to AC load 30, and in addition, converts AC power from the AC power supply to DC power for supplying to the first storage battery 1a and second storage battery 40.

The controller 40 acquires a temperature Ta, voltage Va, and current Ia of first battery 1a based on first temperature sensor 2a, first voltage sensor 3a, and first current sensor 4a, respectively, and further acquires a temperature Tb, voltage Vb and current Ib of second battery 1b based on the second temperature sensor 2b, second voltage sensor 3b, and second current sensor 4b. Further, controller 40 acquires from converter 10 a charging power from AC power source 20 and load power to the AC load 30. Based on this information, the storage battery system is controlled.

Figure 2:
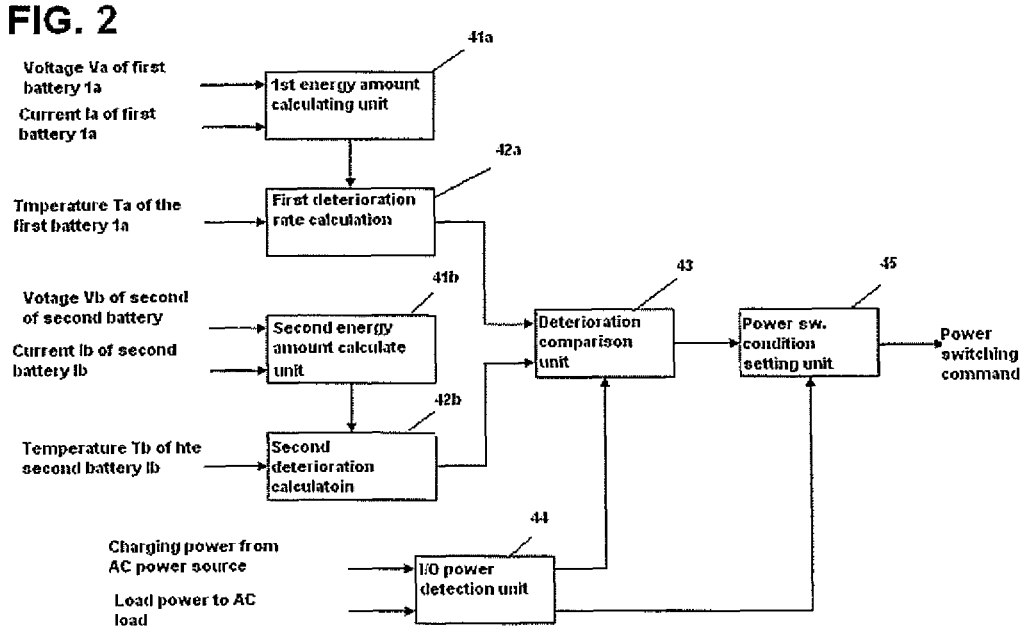
FIG. 2 is a functional block diagram of the controller.

FIG. 2 shows a functional block diagram of the controller 40. As shown in FIG. 2, controller 40 is provided with a first energy amount calculating unit 41a, second energy amount calculating unit 41b, first deterioration rate calculating unit 42a, second deterioration calculating unit 42b, deterioration rate comparison unit 43, input/output power detection unit 44, and power switching condition setting unit 45.

The first energy amount calculating unit 41a obtains the voltage Va and current Ia of the first battery 1a detected by the first voltage sensor 3a and first current sensor 4a, and calculates the energy amount (charged capacity) Sa based on these voltage Va and current Ia. The energy amount Sa of first battery 1a may be calculated, for example, by using a table showing a relationship between the voltage Va and energy amount Sa, or, by integrating the current Ia, or by their combination. The energy amount Sa of the first storage battery 1a is transmitted to the first deterioration or degradation rate calculating unit 42a.

The second energy amount calculating unit 41b obtains the voltage Vb and current Ib of the second battery 1b detected by the second voltage sensor 3b and the second current sensor 4b, respectively and based on these voltage Vb and current Ib, calculates the energy amount (charged capacity) Sb of the second battery 1b. Note that the energy amount Sb of the second storage battery 1b may be calculated in the same way as that for energy amount Sa of the first battery 1a. The energy amount Sb of the second battery 1b calculated is transmitted to the second deterioration rate calculating unit 42b.

The first deterioration rate calculating unit 42a calculates the deterioration rate Da of the first battery 1a based on the temperature Ta of the first battery 1a detected by the first temperature sensor 2a and the energy amount Sa of the first battery 1a calculated by the first energy amount calculating unit 41a. Specifically, the first deterioration rate calculating unit 42a first uses a temperature-deterioration rate table representing a previously stored relationship between the temperature and deterioration rate and obtains the deterioration rate DTa based on the temperature of the first battery 1a. Subsequently, the first deterioration rate calculating unit 42a uses an energy amount-deterioration rate table representing a previously stored relationship between the energy amount and deterioration rate and obtains the deterioration rate DSa based on the energy amount of the first battery 1a. Then, the first deterioration rate calculating unit 42a calculates the deterioration rate Da of the first battery 1a based on the deterioration rate DTa based on the temperature and deterioration rate DSa based on the energy amount. In the present embodiment, the deterioration rate Da of the first battery 1a is obtained by multiplying the deterioration rate DTa and deterioration rate DSa, i.e. in accordance with the equation, $$Da=DTa*DSa,$$

Finally, the first deterioration rate calculating unit 42a sends the calculated deterioration rate Da of the first battery 1a to the deterioration rate comparison unit 43, together with the deterioration rate DTa based on the temperature and the deterioration rate DSa based on the energy amount.

In addition, the second deterioration rate calculating unit 42b calculates the deterioration rate Db of the second battery 1b based on the temperature Tb of the second battery 1b detected by the second temperature sensor 2b and the energy amount Sb of the second battery 1b calculated by the second energy amount calculating unit 41b. Note that the deterioration rate Db of the second battery 1b may be obtained as in the case of the first deterioration rate calculating unit 42a. Specifically, first by obtaining the deterioration rate DTb based on the temperature of the second battery 1b as well as the deterioration rate DSb based on energy amount Sb of the second battery 1b, respectively, based on these DTb and DSb, Db may be calculated in accordance with the equation: Db=DTb*DSb. Finally, the second deterioration rate calculating unit 42b sends the calculated deterioration rate Db of the second battery 1b to the deterioration rate comparison unit 43, together with the deterioration rate DTb based on the temperature and the deterioration rate DSb based on the energy amount.

Figure 3A:
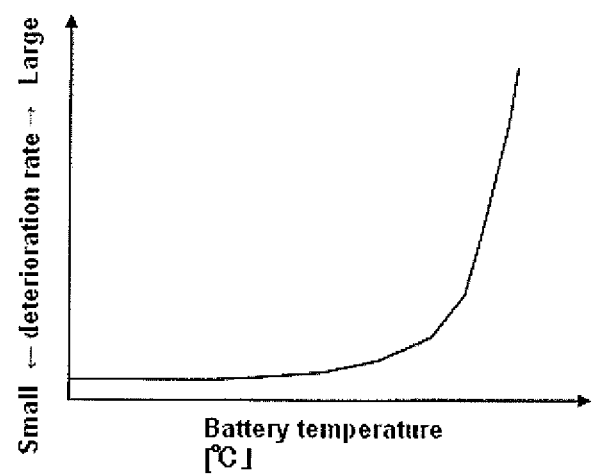
FIG. 3A is a graph showing the relationship between the deterioration or degradation rate and the temperature of each battery.
Figure 3B:
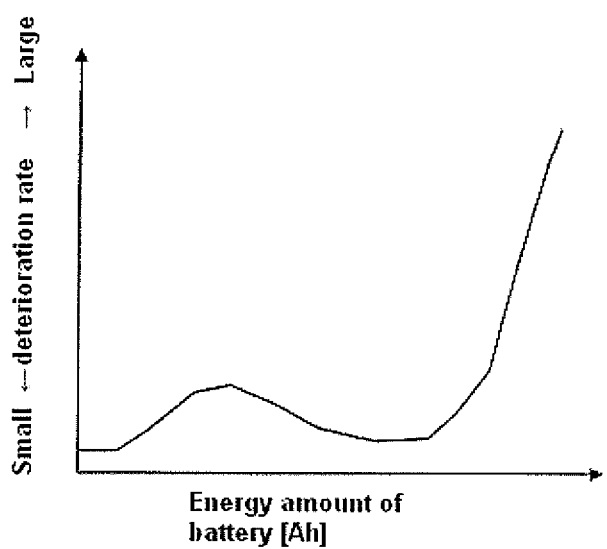
FIG. 3B is a graph showing the relationship between the degradation rate and the energy amount of each battery.

Here, the relationship between the deterioration rate and the temperature of each battery 1a, 1b is shown in FIG. 3A while the relationship between the deterioration rate and the energy amount of each battery 1a, 1b is shown in FIG. 3B. In the present embodiment, the deteriorations in both the first and second batteries have a characteristic caused mainly by the influence of temperature and energy amount. More specifically, as shown in FIG. 3A, both the first battery 1a and the second battery 1b show a higher deterioration rate as the temperature increases. On the other hand, both the first battery 1a and second battery 1b vary the deterioration rate deepening on the energy amount.

Therefore, in the present embodiment, the temperature-deterioration rate table representing the relationship between the temperature and the deterioration rate as well as the energy amount-deterioration rate table showing the relationship between the energy amount and deterioration rate as shown in FIG. 3A and FIG. 3B, are previously stored, and based on these, the deterioration rates DTa, DTb based on the respective temperatures and the deterioration rates DSa, DSb based on the respective energy amounts of respective batteries 1a, 1b are obtained to finally calculate the deterioration rates Da, Db for respective batteries 1a, 1b.

The deterioration rate comparison unit 43 compares the deterioration rate Da of first battery 1a and the deterioration rate Db of second battery 1b, and determines whether or not the difference (|Da−Db|) is greater than a predetermined value α. Then, the deterioration rate comparison unit 43 causes the energy amount either in the first battery 1a or the second battery 1b to be changed, when the difference between the deterioration rate Da of the first battery 1a and the deterioration rate Db of the second battery 1b is equal to or greater than the predetermined value α, and thus calculates a target energy amount which would allow the deterioration rates of both the first battery 1a and the second battery 1b to come closer to each other to take about the same value. Note that the specific calculation method of target energy amount by the deterioration rate comparison unit 43 is described below.

The input/output power detection unit 44 detects the charging power from the AC power source 20 and the load power to the AC load 30, and sends the detection results to both the deterioration rate comparison unit 43 and power switching condition setting unit 45.

The power switching condition setting unit 45 sets the power switching condition for disconnection/connection of the first power switching unit 5a provided with first battery 1a and the second power switching unit 5b provided with the second battery 1b, respectively based on the target energy amount calculated by deterioration rate comparison unit 43, charging power from AC power source 20 detected by the input/output power detection unit 44, and load power of AC load 30, and in accordance with these, a power switching command will be emitted. Note that the specific method for setting the power switching condition by the power switching condition setting unit 45 will be described below.

Then, description is made of the deterioration rate adjustment process pertaining to the present embodiment. FIG. 4 is a flow chart showing a deterioration rate adjustment process according to the present embodiment.

First, in step S1, the first energy amount calculating unit 41a and the first deterioration rate calculating unit 42a of the controller 40 obtains the temperature Ta, voltage Va, and current Ia of the first battery 1a. Further, similarly, the second energy amount calculating unit 41b and the second deterioration calculating unit 42b of the controller 40 obtain the temperature Tb, voltage Vb, and current Ib of the second battery 1b.

In step S2, the first energy amount calculating unit 41a of the controller 40 calculates the energy amount Sa of the first battery 1a based on the voltage Va and Ia obtained in step S1, and the calculated energy amount Sa is sent to the first deterioration rate calculating unit 42a. Also, similarly, the second energy amount calculating unit 41b of the controller 40 calculates the energy amount Sb of the second battery 1b based on the voltage Vb and current Ib of the second battery 1b obtained in step S1, and the calculated energy amount Sb is sent to the second deterioration rate calculating unit 42b.

In step S3, the first deterioration rate calculating unit 42a of the controller 40 calculates the deterioration rate Da of the first battery 1a based on the temperature Ta of the first battery 1a obtained in step S1, and the energy amount S a of the first battery 1a obtained in step S2, with reference to the temperature-deterioration rate table representing the relationship between the temperature and deterioration rate shown in FIG. 3A and the energy amount-deterioration rate table representing the relationship between the energy amount and deterioration rate shown in FIG. 3B to calculate the deterioration rate DTa due to temperature and the deterioration rate DSa due to energy amount, respectively.

Finally, the first deterioration rate calculating unit 42a sends the calculated deterioration rate Da of the first battery 1a to deterioration rate comparison unit 43 together with the deterioration rate DTa based on the temperature and the deterioration rate DSa based on the energy amount.

Similarly, the second deterioration rate calculating unit 42b of the controller 40 calculates the deterioration rate Db of the first battery 1a based on the temperature Tb of the second battery 1b obtained in step S1, and the energy amount Sb of the second battery 1b obtained in step S2, with reference to the temperature-deterioration rate table representing the relationship between the temperature and deterioration rate shown in FIG. 3A and the energy amount-deterioration rate table representing the relationship between the energy amount and deterioration rate shown in FIG. 3B to calculate the deterioration rate DTb due to temperature and the deterioration rate DSb due to energy amount, respectively.

Finally, the second deterioration rate calculating unit 42b sends the calculated deterioration rate Db of the second battery 1b to deterioration rate comparison unit 43 together with the deterioration rate DTb based on the temperature and the deterioration rate DSb based on the energy amount.

In step S4, the deterioration rate comparison unit 43 compares the deterioration rate Da of the first battery 1a and the deterioration rate Db of the second battery 1b calculated in step S3, and determines whether or not the difference exceeds a predetermined value α. When the difference of the deterioration rate Da of the first battery 1a and the deterioration rate Db of the second battery is determined to exceed the predetermined value a, it is determined that a process to adjust the deterioration rates is necessary, and control advances to step S5. On the other hand, when the difference between the deterioration rate Da of the first battery 1a and the deterioration rate Db of the second battery 1b is below the predetermined value α, then the adjustment process to adjust the deterioration rates is not determined to be necessary, and the present process ends.

In step S5, the input/output power detection unit 44 detects a charging power from AC power source and the load power to AC load 30. The input/output power detection unit 44 sends to the deterioration rate comparison unit 43 and power switching condition setting unit 45 either a charging power when charging power is detected or load power when load power is detected. Then, the deterioration rate comparison unit 43 determines whether or not either the first battery 1a or second battery 1b may be disconnected or cut off from power line based on the detected charging power or load power. Subsequent to this, when either the first battery or second battery may be determined to be disconnectable, in order to perform the process to adjust the deterioration rate, control proceeds to step S6. On the other hand, neither the first battery 1a nor the second battery 1b may be disconnectable from the power line, the present process ends.

Note that the determination whether either of first battery 1a or second battery 1b may be disconnected from power line is made depending upon, when load power is detected, i.e., when both the first battery 1a and second battery 1b are in discharged state (output state), the detected load power being capable of being supplied from either one of the first battery 1a or second battery 1b. Further, when a charging power is detected, i.e., when both the first battery la and second battery 1b are in charging state (input state), then that determination is made depending upon whether the detected charging power may be input either one of the first battery 1a or second battery 1b.

In step S6, the deterioration or degradation rate comparison unit 43 calculates the target energy amount. More specifically, the deterioration rate comparison unit 43 calculates a deterioration rate DSa' or DSb' satisfying either equations (1) or (2) stated below, based on the deterioration rate DTa based on the temperature of first battery 1a, deterioration rate DSa based on energy amount, deterioration rate DTb based on temperature of the first battery on the one hand, and deterioration rate DTb based on temperature and deterioration rate DSb based on the energy amount of second battery. Subsequently, target energy amounts Sa' or Sb' to attain the deterioration rates Dsa' and DSb'.

$$(DTa \times DSa) = (DTb \times DSb') \quad (1)$$

$$(DTa \times DSa') = (DTb \times DSb) \quad (2)$$

Figure 5A:
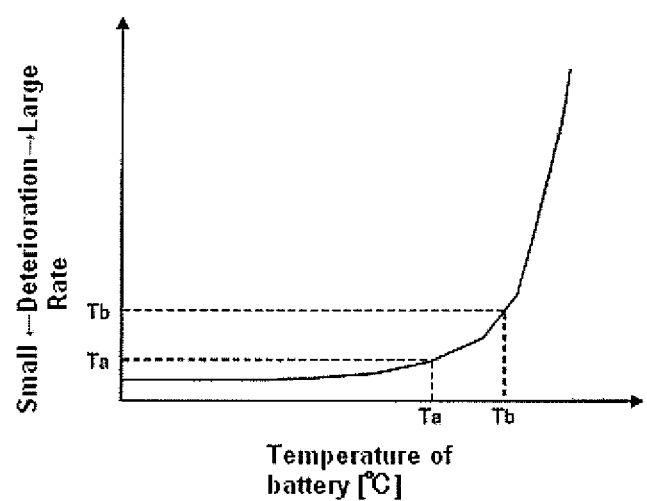
FIG. 5A shows the relationship between the degradation rate and temperature with respect to each storage battery in the case of one scene.
Figure 5B:
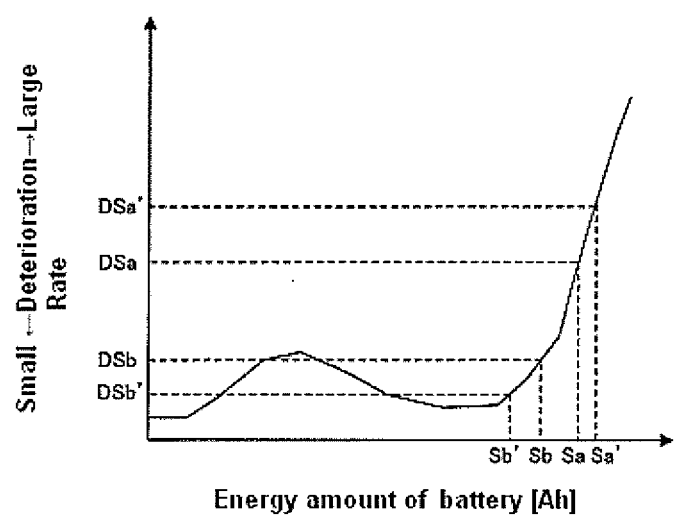
FIG. 5B shows the relationship between energy amount and deterioration speed.

Hereinafter, the method for calculating the target energy amounts Sa' or Sb' will be described with reference to an example of scenes shown in FIG. 5A and FIG. 5B. Note that FIG. 5A shows the relationship between temperature and deterioration rate for respective batteries 1a, 1b. FIG. 5B shows a relationship between the energy amount and deterioration rate for respective batteries 1a, 1b. In addition, as shown in FIG. 5A and FIG. 5B, in the present scene, the deterioration rate DTa based on the temperature of first battery 1a is smaller than the deterioration rate DTb based on the temperature of second battery 1b (i.e., DTa<DTb), and the deterioration rate DSa based on the energy amount of first battery 1a is larger than the deterioration rate DSb of the second battery 1b (DSa>DSb). Moreover, the deterioration rate Da of the first battery 1a is smaller than the deterioration rate Db of the second battery 1b. Stated another way, the scene meeting the following equation (3) is being presumed:

$$(DTa \times DSa) < (DTb \times DSb) \quad (3)$$

Further, in the example scene shown in FIG. 5A, FIG. 5B, if the first battery 1a and the second battery 1b are in the discharging state (output state), i.e., when load power is detected in step S5, as shown in FIG. 5(B), such a deterioration rate DSb' (DSb'<DSb) to meet the equation (1) is acquired, and the energy amount Sb' (Sb'<Sb) corresponding to this is set as a target energy amount.

Alternatively, as shown in the example scene shown in FIG. 5A, FIG. 5B, when the first battery 1a and second battery 2b are in the charging state (input stata), i.e., when charging power is detected in step S5, as shown in FIG. 5(B), such a deterioration rate DSa' meeting the equation (2) described above (DSa'>DSa), and the energy amount Sa' (Sa'>Sa) corresponding to this is set as a target energy amount.

(2) described above is acquired, ant the energy amount Sa' (Sa'>Sa) corresponding to this is set as a target energy amount.

In addition, as shown in Table 1 (C), when the deterioration rate Da of the first battery 1a is greater than the deterioration rate Db of the second battery 1b, i.e., the relationship expressed by (DTa×DSa)>(DTb×DSb) is mat, and when the first battery 1a and second battery 1b are in the discharging state, the deterioration rate DSa' (DSa'<DSa) meeting the equation (2) described above is acquired, ant the energy amount Sa' (Sa'<Sa) corresponding to this is set as a target energy amount.

Also, as shown in Table 1 (D), when the deterioration rate Da of the first battery 1a is greater than the deterioration rate Db of the second battery 1b, i.e., the relationship expressed by (DTa×DSa)>(DTb×DSb) is mat, and when the first battery 1a and second battery 1b are in the charging state, the deterioration rate DS b' (DS b'>DS b) meeting the equation (1) described above is acquired, ant the energy amount S b' (Sb'>S b) corresponding to this is set as a target energy amount.

Subsequently, the deterioration rate comparison unit 43 sends the target energy amount Sa' or Sb' to the power switching condition setting unit 45.

In step S7, the power switching condition setting unit 45 performs a process to interrupt or cut off the power switching unit out of the first power switching unit 5a and second power switching unit 5b so as to adjust the deterioration rates of the first battery 1a and the second battery 1b.

That is, as shown in Table 1 (A), when the relationship expressed by the formula: (DTa×DSa)<(DTb×DSb) is met, and the first battery 1a and the second battery 1b are in the discharging state (output state), thus Sb' (Sb'<Sb) is calculated as the target energy amount, then only the second battery 1b is discharged (output), and in order for the energy amount of the second battery 1b to attain the target energy amount Sb', the first power switching unit 5a is set as the power switching unit to be disconnected.

Also, as shown in Table 1 (B), when the relationship expressed by the formula (DTa×DSa)<(DTb×DSb) is met,

TABLE 1

| CHARGING OR DISCHARGE STATE? | RELATIONSHIPE BETWEEN DETERIORATION RATES | DETERIORATIN RATE TO BE CALCULATED | TARGET ENERGY AMOUNT | POWER SW. DEVICE TO BE DISCONNECTED |
|---|---|---|---|---|
| (A) DISCHARGING | (DTa × DSa) < (DTb × DSb) | DSb→DSb'(DSb' < DSb) | Sb→Sb'(Sb' < Sb) | FIRST POWER SW 5a |
| (B) CHRGING | (DTa × DSa) < (DTb × DSb) | DSa→DSa'(DSa' > DSa) | Sa→Sa'(Sa' > Sa) | SECOND POWER SW 5b |
| (C) DISCHARGING | (DTa × DSa) > (DTb × DSb) | DSa→DSa'(DSa' < DSa) | Sa→Sa'(Sa' < Sa) | SECOND POWER SW 5b |
| (D) CHRGING | (DTa × DSa) > (DTb × DSb) | DSb→DSb'(DSb' > DSb) | Sb→Sb'(Sb' > Sb) | FIRST POWER SW 5a |

Thus, in the present embodiment, as shown in Table 1 (A), when the deterioration rate Da of the first battery 1a is smaller than the deterioration rate Db of the second battery 1b, i.e., the relationship expressed by (DTa×DSa)<(DTb×DSb) is met, and when the first battery 1a and second battery 1b are in the discharging state, the deterioration DSb' (DSb'<DSb) meeting the equation (1) described above is acquired, ant the energy amount Sb' (Sb'<Sb) corresponding to this is set as a target energy amount.

Further, as shown in Table 1 (B), when the deterioration rate Da of the first battery 1a is smaller than the deterioration rate Db of the second battery 1b, i.e., the relationship expressed by (DTa×DSa)<(DTb×DSb) is mat, and when the first battery 1a and second battery 1b are in the charging state, the deterioration rate DSa' (DSa'>DSz) meeting the equation (2) described above is acquired, ant the energy amount Sa' (Sa'>Sa) corresponding to this is set as a target energy amount.

and the first battery 1a and second battery 1b are in the charging state (input state), thus Sa' (Sa'>Sa) is calculated as the target energy amount, then only the first battery 1a is charged (input), and in order for the energy amount of the first battery 1a to attain the target energy amount Sa', the second power switching unit 5b is set as the power switching unit to be disconnected.

Furthermore, as shown in Table 1 (C), when the relationship expressed by the formula: (DTa×DSa)>(DTb×DSb) is met, and the battery 1a and the second battery 1b are in the discharging state (output state), thus Sa' (Sa'<Sa) is calculated as the target energy amount, then only the first battery 1a is discharged (output), and in order for the energy amount of the first battery 1a to attain the target energy amount Sa', the second power switching unit 5b is set as the power switching unit to be disconnected.

As shown in Table 1 (D), when the relationship expressed by the formula, (DTa×DSa)<(DTb×DSb) is met, and the first battery 1a and second battery 1b are in the charging state (input state), thus Sb' (Sb'>Sb) is calculated as the target energy amount, then only the second battery 1b is charged (input), and in order for the energy amount of the second battery 1b to attain the target energy amount Sb' (Sb'>Sb), the first power switching unit 5a is set as the power switching unit to be disconnected In step S8, the power switching condition setting unit 45 sets a disconnection time ts for blocking either the first power switching unit 5a or second power switching unit 5b based on either load power or charging power detected in step S5, and target energy amount Sa' or Sb' calculated in step S6.

For example, in the example scene shown in FIG. 5A, FIG. 5B, when the first battery 1a and the second battery 1b are in discharging state, i.e., when at step S5, the load power is detected, and when Sb' (Sb'<Sb) is calculated in step S6 as target energy amount, the time required for the energy amount of the second battery 1b to take from the energy amount Sb to Sb' of the second battery 1, when discharged with the load power, is set the disconnecting time ts for disconnecting the first power switching unit 5a.

Alternatively, in the example scene shown in FIG. 5A, FIG. 5B, when the first battery 1a and the second battery 1b are in charging state, i.e., when at step S5, the charging power is detected, and when Sa' (Sa'>Sa) is calculated in step S6 as target energy amount, the time required for the energy amount of the first battery 1a from the energy amount Sa to Sa' of the first battery 1a if charged by the charging power is set the disconnection time ts for disconnecting the second power switching unit 5b.

In step S9, the power switching condition setting unit 45 sends a power switching command to the power switching unit that has been identified as the power switching device to be disconnected out of the first power switching unit 5a and the second power switching unit 5b. For example, in step S7, when the first power switching unit 5a is being selected as the power switching device to be disconnected, a power switching command is sent to the first power switching unit 5a for cutting off from power line, and in response thereto, the first power switching unit 5a disconnects the first battery 1a from power line, and only the second battery 1b is charged (input) or discharged (output). Alternatively, in step S7, when, as the power switching unit to be disconnected, the second power switching unit 5b is being set, then the power switching command will be sent to the second power switching unit 5b, and in response thereto, the second power switching unit 5b cuts off the second battery 1b from power line, and only the first battery 1a is to be charged (input) or discharge (output).

In step S10, the power switching condition setting unit 45 determines whether or not the disconnection time ts has elapsed from the transmittal timing of the power switching command to disconnect from power line being issued. Unless the disconnection time ts has elapsed, step S10 is repeated until the disconnection time being elapsed.

On the other hand, upon elapse of the predetermined time ts, control proceeds to step S11.

In step S11, since the disconnection time ts has elapsed, it is determined that the first battery 1a or second battery 1b has attained the target energy amount Sa' or Sb' set in step S8, and further the deterioration rate Da of first battery 1a, (i.e., Da=DTa*DSa), and the deterioration rate Db (i.e., Db=DTb×DSb) of the second battery 1b are substantially equal to each other. Subsequently, the process to end the deterioration rate adjustment is performed.

Specifically, the power switching condition setting unit 45 acts on the power switching unit out of the first power switching unit 5a and second power switching unit 5b, to which a power switching command has been issued in step S9 to disconnect from the power line, and now sends another power switching command for connecting to the power line, thereby connecting either the disconnected first battery 1a or second battery 1b to power line.

As described above, the deterioration or degradation rate adjustment process according to the present embodiment is performed.

In the present embodiment, a deterioration rate DTa based on the temperature, a deterioration rate DSa based on the energy amount of the first battery 1a, as well as a deterioration rate DTb based on the temperature, a deterioration rate DSb based on the energy amount of the second battery 1b, the deterioration Da of the first battery is calculated according to the equiation Da=DTa*DSa while the deterioration Db of the second battery is calculated according to the equation Db=DTb*DSb, respectively. Then, a target energy amount is acquired that would allow these to be substantially equal, i.e., DTa*DSa≈DTb*DSb, and on this basis, the amount of power to be input to or output from the first battery 1a and the second battery 1b is controlled. Thus, variation in deterioration may be resolved, and the lifetime of the battery may be consequently improved. In particular, according to the present embodiment, without providing a separate temperature control system to the first battery 1a and the second battery 1b, the deterioration variations between the first battery 1a and the second battery 1b may be eliminated, so that a compact and lightweight battery system may be achieved with constant reduction accompanied.

Further, for example, when the battery system in the present embodiment is applied to a stationary battery system, in general, in the case of the stationary storage battery system, the capacity of each battery constituting the battery system is configured to be much larger than the load power required to drive the AC load. Therefore, in the present embodiment, in order to adjust deterioration rate, even if the battery making up the battery system is cut off from the power line, deterioration variation may be eliminated without causing a problem with respect to power supply to the AC load (i.e. without causing power supply shortage).

In addition, according to this embodiment, when eliminating the variation in deterioration or degradation rate of first battery 1a and second battery 1b, since the first power switching unit 5a and second power switching unit 5b each dedicated to the first battery 1a and second battery 1b are made use of, it is not necessary to add new devices to eliminate the deterioration variation. Therefore, a compact and lightweight battery system with constant reduction may be available.

Note that in the embodiment described above, the temperature sensor 2a, 2b corresponds to the temperature detecting unit according to the present invention, the first energy amount calculating unit 41a and second energy amount calculating unit 41b correspond to the energy amount detection unit, the first deterioration rate calculating unit 42a corresponds to the control unit and first calculating unit according to the present invention, the second deterioration rate calculating unit 42b corresponds to the control unit and second calculating unit, and the deterioration rate comparison unit 43 and power switching condition setting unit 45 correspond to the control unit according to the present invention, respectively.

Although description has been made of embodiments according to the present invention, these embodiments are described to make the understanding of the present invention easy, thus not intended to limit the present invention. Therefore, respective elements disclosed in the embodiments described above are intended to include all design modifications and equivalents thereof belonging to the technical scope of the present invention.

Note that in the embodiment described above, such a configuration is possible in which, when performing a deterioration rate adjustment process, the voltage Va of the first battery 1a and the voltage Vb of the second battery 1b are compared, and when the difference between these voltages Va, Vb falls below a predetermined value, the deterioration rate adjustment process will be performed. In other words, when the difference between voltage Va and Vb exceeds a predetermined value, the deterioration rate adjustment control may be refrained from being executed. By configuring the deterioration rate adjustment control to be executed only when the difference between voltages Va and Vb is below the predetermined value, for example, a possible shortening of lifetime of the battery may be effectively avoided due to control in which one of the first battery 1a and second battery 1b is disconnected from power line and subsequently connected again upon termination of deterioration rate adjustment which allows an instantaneous flow of current from the high-voltage battery to low-voltage battery causing the battery system temperature to increase and the lifetime of the battery system will be shortened.

Further, in the embodiment described above, when calculating a target energy amount by the deterioration rate comparison unit 43, change in temperature of the first battery 1a and the second battery 1b may be predicted in response to the power to be input to or output from the first and second batteries, and in consideration of the prediction results, the target energy amount may be calculated. In particular, in storage battery, the time constant with respect to the input/output of power may take a relatively large value depending on the size of battery, i.e., heat capacity. In this case, by taking the prediction results of temperature change into consideration, the target energy amount required to cause the deterioration rate Da of the first battery 1a to be substantially equal to the deterioration rate Db of the second battery 1b may be calculated with high accuracy.

Further, in the above embodiment, the present invention is applied to an example of battery system in which the storage batteries are connected in parallel by two rows. However, it is of course possible for the present invention to apply to the battery system of three or more of rows of batteries connected in parallel.

The invention claimed is:

1. A battery control device for controlling a storage battery system consisting of a plurality of storage batteries connected in parallel, comprising:
a temperature detecting unit configured to detect a temperature of each storage battery;
an energy amount detecting unit configured to detect an energy amount of each storage battery;
a control unit programmed to:
calculate a deterioration rate of each storage battery connected in parallel based on the temperature detected by the temperature detecting unit and the energy amount detected by the energy amount detecting unit;
control an amount of power to be selectively input to or output from each battery by controlling a power switching unit associated with each storage battery connected in parallel;
when the power is to be input, control the power switching unit to disconnect from storage batteries with a fast deterioration rate while allowing input only to storage batteries with a slow deterioration rate; and
when the power is to be output from the storage battery system, control the power switching unit to disconnect output of the storage batteries with a slow deterioration rate while allowing output only from the storage batteries with the fast deterioration rate.

2. The battery control device claimed in claim 1, wherein the control unit is executed to control power to be input to or output from each storage battery connected in parallel when a voltage between any two of the plurality of storage batteries connected in parallel is below a predetermined value.

3. The battery control device claimed in claim 1, wherein the control unit predicts a change in temperature of each storage battery when power is input to or output from each storage battery connected in parallel, and the control unit controls the amount of power to be input to or output from each storage battery connected in parallel based on predicted results.

4. A battery control device for controlling a storage battery system consisting of a plurality of storage batteries connected in parallel, comprising:
a temperature detecting unit configured to detect a temperature of each storage battery;
an energy amount detecting unit configured to detect an energy amount of each storage battery;
a first calculation unit that calculates, with respect to a first storage battery out of the plurality of storage batteries connected in parallel, the deterioration rate DTa based on the temperature and the deterioration rate DSs based on the energy amount;
a second calculation unit that calculates, with respect to a second storage battery diriment from the first storage battery, the deterioration rate DTb based on the temperature and a deterioration rate DSb based on the energy amount; and
a control unit programmed to control an amount of power to be input to or output from each battery connected in parallel so that the deterioration rates of each battery are similar to each other, wherein
the control unit calculates an energy amount that satisfies the equation $$(DTa \times DSa) = (DTb \times DSb)$$

as a target energy amount with respect to one or both of the first storage battery and the second storage battery, and controls the amount of power to be input to or output from the one or both of the first storage battery and the second storage battery in order for the one or both of the first storage battery and second storage battery to attain the target energy amount, wherein:
DTa, DTb are the deterioration rates based on the respective temperatures and
DSa and DSb are the deterioration rates based on the respective energy amounts.

5. The battery control device claimed in claim 4, wherein the control unit controls the amount of power to be selectively input to and output from each battery by controlling a power switching unit associated with each storage battery connected in parallel.

6. The battery control device claimed in claim 5, wherein the control unit determines whether the energy to be input to or output from the storage battery system is in an input state or an output state;
when the power to be input to or output from the storage battery system is determined to be in the input state, the control unit controls the power switching unit to disconnect the input to the storage battery with a fast deterioration rate while allowing input only to the storage battery with a slow deterioration rate;

when the power to be input to or output from the storage battery system is determined to be in the output state, the control unit controls the power switching unit to disconnect output of the storage battery with a slow deterioration rate while allowing output only from the storage battery with the fast deterioration rate.

* * * * *